(12) United States Patent
Kim et al.

(10) Patent No.: US 9,926,639 B2
(45) Date of Patent: Mar. 27, 2018

(54) METHODS FOR FORMING BARRIER/SEED LAYERS FOR COPPER INTERCONNECT STRUCTURES

(75) Inventors: Hoon Kim, San Jose, CA (US); Wei Ti Lee, San Jose, CA (US); Sang Ho Yu, Cupertino, CA (US); Seshadri Ganguli, Sunnyvale, CA (US); Hyoung-Chan Ha, San Jose, CA (US); Sang Hyeob Lee, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 722 days.

(21) Appl. No.: 13/167,001

(22) Filed: Jun. 23, 2011

(65) Prior Publication Data
US 2012/0012465 A1 Jan. 19, 2012

Related U.S. Application Data

(60) Provisional application No. 61/365,082, filed on Jul. 16, 2010.

(51) Int. Cl.
*C25D 5/02* (2006.01)
*H01L 21/768* (2006.01)
*H01L 21/285* (2006.01)

(52) U.S. Cl.
CPC ............ *C25D 5/02* (2013.01); *H01L 21/2855* (2013.01); *H01L 21/28556* (2013.01); *H01L 21/28562* (2013.01); *H01L 21/76831* (2013.01); *H01L 21/76846* (2013.01); *H01L 21/76864* (2013.01); *H01L 21/76873* (2013.01); *H01L 21/76898* (2013.01)

(58) Field of Classification Search
CPC .......................................... C23C 16/02–16/20

USPC ......... 257/751, 741; 438/478; 427/250, 585; 148/518; 428/450; 205/131
See application file for complete search history.

(56) References Cited

U.S. PATENT DOCUMENTS 6,399,496 B1 * 6/2002 Edelstein et al. ............. 438/687
7,264,846 B2 * 9/2007 Chang et al. .............. 427/248.1
(Continued)

FOREIGN PATENT DOCUMENTS

JP 2010021477 A * 1/2010
WO WO 2010004998 A1 * 1/2010

OTHER PUBLICATIONS

International Search Report and Written Opinion dated Feb. 20, 2012 for PCT Application No. PCT/US2011/043626.
U.S. Appl. No. 13/155,520, filed Jun. 8, 2011, Kim et al.

*Primary Examiner* — Louis J Rufo
(74) *Attorney, Agent, or Firm* — Moser Taboada; Alan Taboada

(57) ABSTRACT

Methods for forming barrier/seed layers for interconnect structures are provided herein. In some embodiments, a method of processing a substrate having an opening formed in a first surface of the substrate, the opening having a sidewall and a bottom surface, the method may include forming a layer comprising manganese (Mn) and at least one of ruthenium (Ru) or cobalt (Co) on the sidewall and bottom surface of the opening; and depositing a conductive material on the layer to fill the opening. In some embodiments, one of ruthenium (Ru) or cobalt (Co) is deposited on the sidewall and bottom surface of the opening. The materials may be deposited by chemical vapor deposition (CVD) or by physical vapor deposition (PVD).

11 Claims, 2 Drawing Sheets

(56) References Cited

U.S. PATENT DOCUMENTS

| | | | |
|---|---|---|---|
| 7,442,267 B1* | 10/2008 | Webb et al. | 148/518 |
| 7,727,882 B1* | 6/2010 | Wu | H01L 21/2855 |
| | | | 257/E21.584 |
| 2008/0280151 A1* | 11/2008 | Jourdan et al. | 428/450 |
| 2009/0053426 A1 | 2/2009 | Lu et al. | |
| 2009/0160055 A1 | 6/2009 | Lavoie | |
| 2009/0209101 A1* | 8/2009 | Shinriki et al. | 438/686 |
| 2009/0263965 A1 | 10/2009 | Gordon et al. | |
| 2010/0078820 A1* | 4/2010 | Kurokawa et al. | 257/751 |
| 2010/0171220 A1 | 7/2010 | Huang | |
| 2010/0176513 A1 | 7/2010 | Agarwala et al. | |
| 2011/0163451 A1* | 7/2011 | Matsumoto et al. | 257/751 |

* cited by examiner

METHODS FOR FORMING BARRIER/SEED LAYERS FOR COPPER INTERCONNECT STRUCTURES

CROSS-REFERENCE TO RELATED APPLICATIONS

This application claims benefit of U.S. provisional patent application Ser. No. 61/365,082, filed Jul. 16, 2010, which is herein incorporated by reference.

FIELD

Embodiments of the present invention generally relate to methods of processing substrates, and specifically to methods for forming a barrier/seed layers for interconnect structures.

BACKGROUND

As device nodes get smaller (for example, approaching dimensions of about 22 nm or less), manufacturing challenges become more apparent. For example, the combined thickness of barrier and seed layers of typical materials deposited in an opening prior to filling the opening, for example via electroplating, to form an interconnect structure may result in reduced efficiency of the electroplating process, reduced process throughput and/or yield, or the like.

Ruthenium, deposited for example by chemical vapor deposition (CVD), has become a promising candidate as a seed layer for a copper interconnect. However, ruthenium by itself cannot be a copper barrier and barrier layers such as TaN/Ta are still needed prior to ruthenium deposition. Alternatively, copper-manganese, deposited for example by physical vapor deposition (PVD), self-aligned barrier schemes have also gained in popularity as a desirable approach to the barrier solution. However, the inventors have observed that these two schemes each have manufacturability difficulties.

For CVD ruthenium, the deposition rate is very slow without $O_2$ as reducing gas. However, the $O_2$ gas tends to oxidize the tantalum-based barrier layer, resulting in increase via resistance. Therefore, with TaN/Ta as barrier, throughput with CVD ruthenium will be very slow. In addition, deposition of ruthenium without $O_2$ also results in high carbon contaminated ruthenium films, which also increases line/via resistance. A high resistivity ruthenium film is not adequate for a seed layer, which is the main merit of the ruthenium seed layer.

With respect to the Cu—Mn process (a physical vapor deposition, or PVD, process), copper can diffuse into the oxide layer, especially low-k oxide, during the deposition steps, causing reliability issues.

Thus, the inventors have provided improved methods for forming barrier/seed layers for interconnect structures.

SUMMARY

Methods for forming barrier/seed layers for interconnect structures are provided herein. In some embodiments, a method of processing a substrate having an opening formed in a first surface of the substrate, the opening having a sidewall and a bottom surface, the method may include forming a layer comprising manganese (Mn) and at least one of ruthenium (Ru) or cobalt (Co) on the sidewall and bottom surface of the opening; and depositing a conductive material on the layer to fill the opening. In some embodiments, one of ruthenium (Ru) or cobalt (Co) is deposited on the sidewall and bottom surface of the opening. The materials may be deposited by chemical vapor deposition (CVD) or by physical vapor deposition (PVD).

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
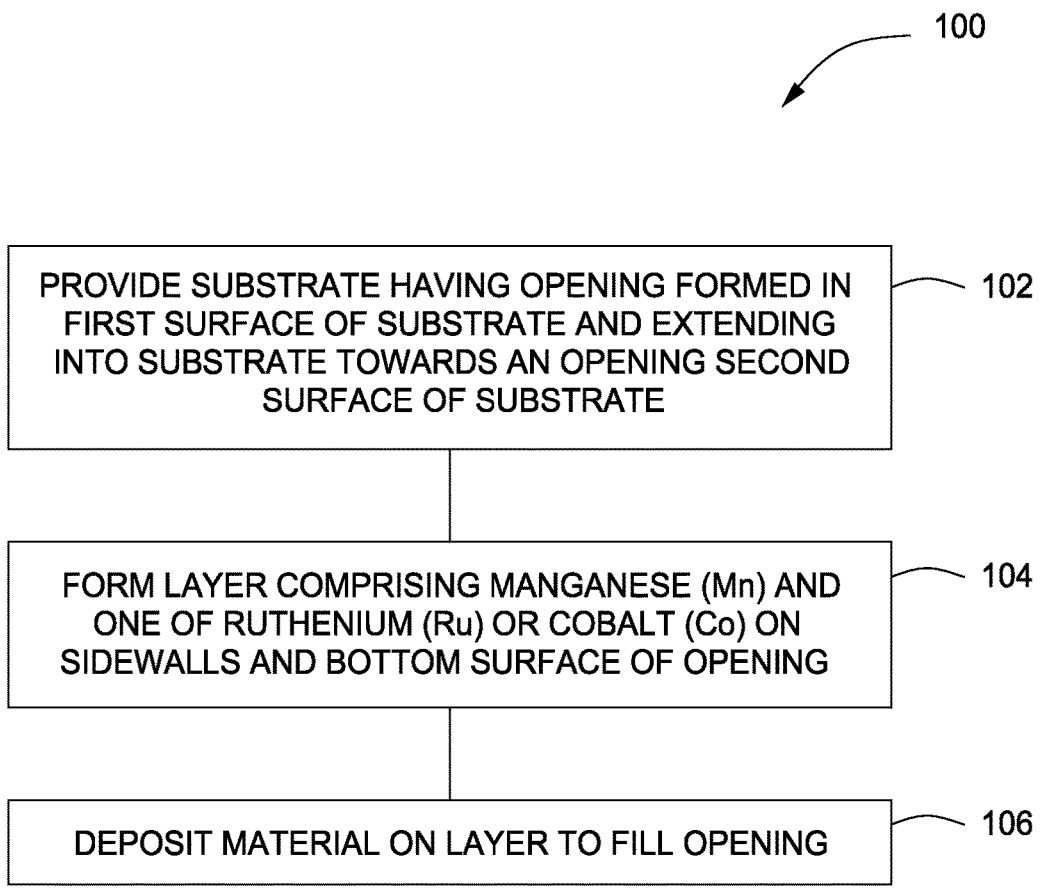
FIG. 1 depicts a flow chart of a method for forming an interconnect structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming barrier/seed layers for interconnect structures are provided herein. As discussed below, the term barrier/seed layer is meant to include any of a layer comprising a seed layer deposited atop a barrier layer, or a layer comprising a barrier layer material and a seed layer material, wherein the barrier and seed layer materials may be deposited in any suitable manner, such as homogenously, graded, or the like within the layer to facilitate both barrier layer and seed layer properties. The inventive methods advantageous facilitate improved efficiency, process throughput, and device quality through one or more of reduced barrier/seed layer thickness, reduced barrier/seed layer resistance, or increased deposition rates. The inventive methods may be utilized with any device nodes, but may be particularly advantageous in device nodes of about 22 nm or less. Further, the inventive methods may be utilized with any type of interconnect structure or material, but may be particularly advantageous with interconnect structures formed by electroplating copper (Cu).

Figure 2:
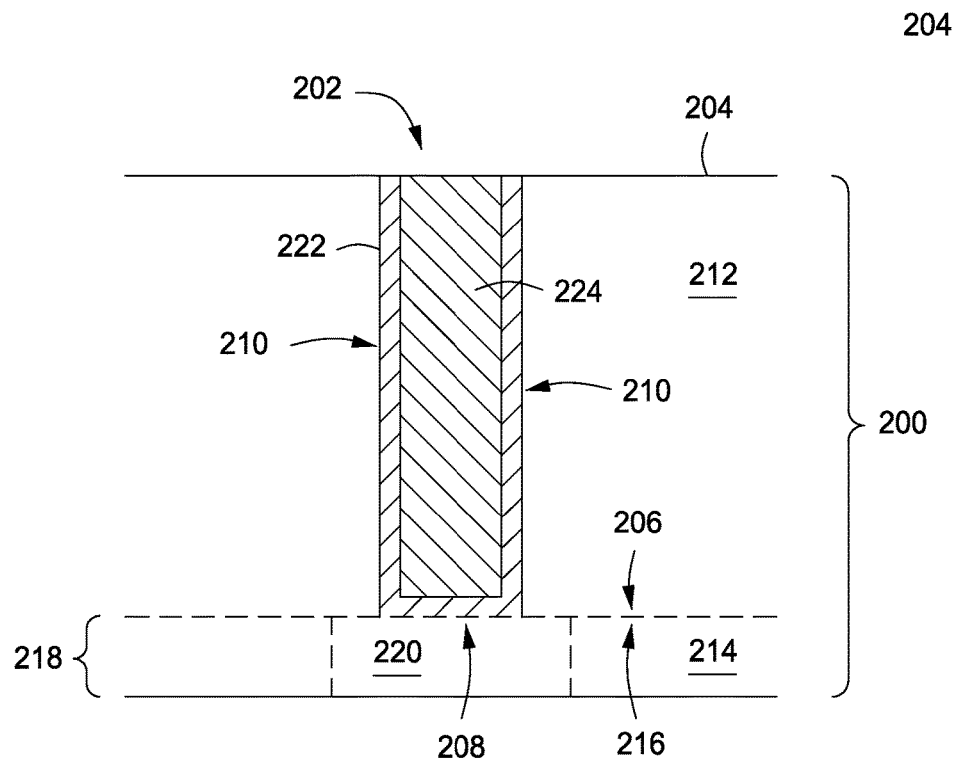
FIG. 2 depicts a side cross-sectional view of an interconnect structure formed in a substrate in accordance with some embodiments of the present invention.

FIG. 1 depicts a flow chart of a method 100 for forming an interconnect structure in accordance with some embodiments of the present invention. The method 100 is described below with respect to an interconnect structure, as depicted in FIG. 2. The method 100 may be performed in any suitable process chambers configured for one or more of PVD, chemical vapor deposition (CVD), or atomic layer deposition (ALD). Exemplary processing systems that may be used to perform the invention methods disclosed herein may include, but are not limited to, those of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including those from other manufacturers, may also be suitably used in connection with the teachings provided herein.

The method 100 generally begins at 102 by providing a substrate 200 having an opening 202, as depicted in FIG. 2. The opening 202 may be formed in a first surface 204 of the substrate 200 and extending into the substrate 200 towards an opposing second surface 206 of the substrate 200. The substrate 200 may be any suitable substrate having an opening formed therein. For example, the substrate 200 may comprise one or more of a dielectric material, Si, metals, or the like. In addition, the substrate 200 may include additional layers of materials or may have one or more completed or partially completed structures formed therein or thereon. For example, the substrate 200 may include a first dielectric layer 212, such as silicon oxide, low-k, or the like, and the opening 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., 220) may be disposed in the second dielectric layer 214 and may be aligned with the opening 202 such that the opening, when filled with a conductive material, provides an electrical path to/from the conductive material. For example, the conductive material may be part of a line or via to which the interconnect is coupled.

The opening 202 may be any opening, such as a via, trench, dual damascene structure, or the like. In some embodiments, the opening 202 may have a height to width aspect ratio of at least about 5:1 (e.g., a high aspect ratio). For example, in some embodiments, the aspect ratio may be about 10:1 or greater, such as about 15:1. The opening 202 may be formed by etching the substrate using any suitable etch process. The opening 202 includes a bottom surface 208 and sidewalls 210.

In some embodiments, the sidewalls 210 may be covered with one or more layers prior to depositing metal atoms as described below. For example, the sidewalls of the opening 202 and the first surface 204 of the substrate 200 may be covered by an oxide layer (not shown), such as silicon oxide ($SiO_2$), silicon carbon nitride, silicon oxicarbide, or the like. The oxide layer may be deposited or grown, for example in a chemical vapor deposition (CVD) chamber or in an oxidation chamber. The oxide layer may serve as an electrical and/or physical barrier between the substrate and one or more of the seed layer or barrier layer materials to be subsequently deposited in the opening, and/or may function as a better surface for attachment during the deposition process discussed below than a native surface of the substrate, and/or may provide a source of oxygen which may be combined with a barrier layer material by annealing or the like to form a final barrier layer and/or barrier layer component of a barrier/seed layer.

In some embodiments, and as illustrated by dotted lines in FIG. 2, the opening 202 may extend completely through the substrate 200 and an upper surface 216 of a second substrate 218 may form the bottom surface 208 of the opening 202. The second substrate 218 may be disposed adjacent to the second surface 206 of the substrate 200. Further (and also illustrated by dotted lines), a conductive material (e.g., 220), for example as part of a device, such as a logic device or the like, or an electrical path to a device requiring electrical connectivity, such as a gate, a contact pad, a conductive line or via, or the like, may be disposed in the upper surface 216 of the second substrate 218 and aligned with the opening 202. In some embodiments, the conductive material 220 aligned with the opening 202 may comprise Cu.

Figures 3A, 3B, 3C:
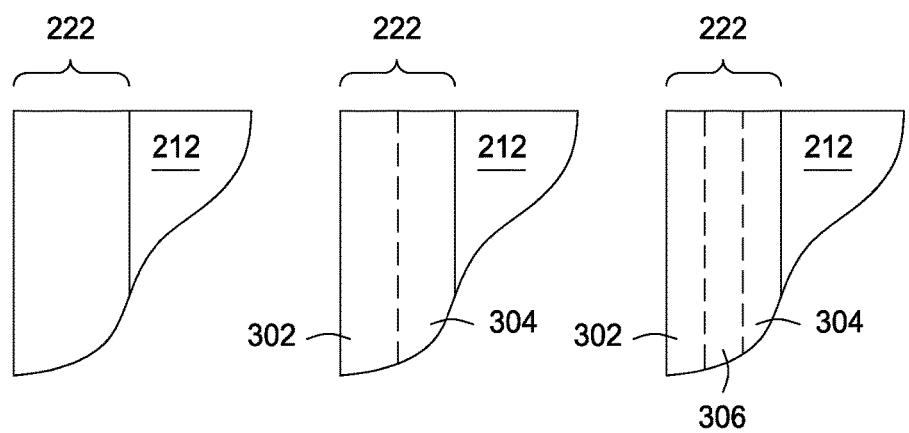
FIGS. 3A-C respectively depict a portion of interconnect structures in accordance with some embodiments of the present invention.

At 102, a layer 222 is formed on the sidewalls 210 and the bottom surface 208 of the opening 202. The layer 222 comprises manganese (Mn) and at least one of ruthenium (Ru) or cobalt (Co). In some embodiments, the layer 222 comprises manganese (Mn) and one of ruthenium (Ru) or cobalt (Co). In some embodiments, the layer 222 may be a single layer having uniform or non-uniform composition through a thickness of the layer. In some embodiments, the layer 222 may be formed from multiple layers deposited atop each other. For example, FIG. 3A depicts the layer 222 formed as a single layer. FIG. 3B depicts the layer 222 formed as two layers, a first layer 302 and a second layer 304 deposited atop the first layer 302. FIG. 3C depicts the layer 222 formed as two layers 302, 304 having a transitional region 306 disposed between the two layers.

For example, in some embodiments, the layer 222 may comprise a barrier layer comprising predominantly Mn and a seed layer comprising predominantly Ru or predominantly Co deposited atop the barrier layer. Alternatively, in some embodiments, the layer 222 may comprise a barrier layer material comprising predominantly Mn and a seed layer material comprising predominantly Ru or predominantly Co, wherein the barrier and seed layer materials are deposited throughout the thickness of the layer 222. For example, the layer 222 may comprise about 10-50 percent, or more, of Mn proximate an interface between the layer 222 and the sidewalls 210 or the bottom surface 208 and may comprise substantially Ru or Co (e.g., about 50 percent or more) proximate an opposing surface of the layer 222.

The layer 222 may have a graded concentration of the barrier layer (e.g., Mn) and seed layer (e.g., Ru or Co) materials between the interface and the opposing surface of the layer 222. For example, the barrier layer material may decrease in concentration from the interface to the opposing surface of the layer 222 and the seed layer material may increase in concentration from the interface to the opposing surface of the layer 222. In addition, the layer 222 may have a first composition in a first portion of the layer 222 proximate the interface between the layer 222 and the substrate 200, a second composition in a second portion of the layer 222 proximate the interface between the layer 222 and the opening 202, with a transitional region disposed therebetween. In some embodiments, when moving from the first portion towards the second portion of the transitional region (e.g., from adjacent the substrate towards the opening), the concentration of the barrier layer material may decrease and the concentration of the seed layer material may increase.

The layer 222 may be formed by CVD, ALD, or PVD processes. For example, a CVD process may be used to deposit any of the aforementioned embodiments of the layer 222 discussed above. For example, in some embodiments, the CVD process may comprise flowing a manganese-containing gas for a first period of time to deposit the barrier layer and then flowing one of a ruthenium-containing gas or a cobalt-containing gas for a second period of time to deposit the seed layer. In some embodiments, the flow of the manganese-containing gas and the ruthenium-containing gas or the cobalt-containing gas may overlap for a third period of time, during which a transitional region of the layer 222 may be deposited. Each of the preceding steps may further comprise flowing a reducing agent along with the precursor gas. The reducing agent may comprise, for example, at least one of hydrogen (H$_2$), ammonia (NH$_3$), oxygen (O$_2$), or hydrogen incorporated gases or the like.

In some embodiments, to achieve a graded concentration of the barrier layer material and the seed layer material during the co-flow step above, a ratio of the manganese-containing gas and one of the ruthenium-containing gas or the cobalt-containing gas may be decreased between a beginning and an end of the third period of time. For example, the ratio may be decreased in steps, for example, wherein each step comprises tuning the ratio at a desired value and flowing at that value for a portion of the third period of time. Alternatively, the ratio may be decreased continuously between the beginning and the end of the second period of time. For example, upon or after beginning the flow of the ruthenium-containing gas or the cobalt-containing gas, the flow of the manganese-containing gas may be reduced until it is stopped. In addition, the flow of the ruthenium-containing gas or the cobalt-containing gas may be kept constant or may be increased during the third period of time.

In some embodiments, for example in an ALD process, a reducing agent, as discussed above, may be flowed simultaneously with or alternately with the flow of the manganese-containing gas and the one of the ruthenium-containing gas or the cobalt-containing gas. In addition, the flows of the respective gases may be alternated with a purge gas flow, such that there is a period of deposition followed by a purge of the chamber to define a deposition cycle, and the deposition cycle is repeated as desired to deposit a desired thickness of material to form the layer 222. In some embodiments, the deposition cycle may be maintained or may be varied throughout multiple deposition steps to obtain a film composition through the layer 222 in any of the desired embodiments as discussed above. For example, the deposition cycle may be uniform to deposit a layer 222 having a substantially uniform composition throughout. Alternatively, the deposition cycle may be varied to deposit a layer 222 having a desired composition of manganese and ruthenium or cobalt in various locations throughout the layer 222, as described above.

General processing conditions for any of the CVD or ALD processes discussed above may include any one or more of forming the layer 222 at a temperature ranging from about 100 degrees Celsius to about 400 degrees Celsius, maintaining chamber pressure at about 1 to about 30 Torr, or about 5 to about 10 Torr. The manganese-containing gas may comprise at least one manganese precursor as disclosed in United States Published Patent Application no. 2009/0263965, filed Mar. 20, 2009, by Roy G. Gordon et al., and entitled, "Self-aligned barrier layers for interconnects," which is hereby incorporated herein by reference in its entirety. The ruthenium-containing gas may comprise at least one of Methyl-cyclohexadine Ru tricarbonylcyclohexadine, Ru tricarbonyl, butadiene Ru tricarbonyl, dimethyl butadiene Ru tricarbonyl, or modified dines with Ru(CO)$_3$. The cobalt-containing gas may comprise at least one of a cobalt precursor disclosed in United States Published Patent Application no. 2009/0053426, filed Aug. 29, 2008, by Jiang Lu et al., and entitled, "Cobalt deposition on barrier surfaces," which is hereby incorporated herein by reference in its entirety.

Alternatively, the layer 222 may be deposited by a PVD process. For example, metal atoms may be sputtered from a target comprising predominantly Ru or Co and further comprising Mn to form the layer 222. For example, the target may comprise one of manganese-ruthenium or manganese-cobalt. In some embodiments, the target may be predominantly ruthenium or predominantly cobalt and may have a manganese content ranging from about 0.1 to about 15 percent. After the metal atoms have been sputtered onto the sidewalls 210 and the bottom surface 208, the layer 222 may be annealed to form an oxide layer comprising manganese, silicon, and oxygen at an interface between the layer 222 and the surfaces of the opening 202. For example, the silicon and oxygen may be present due to the presence of a native or deposited layer of silicon oxide, or other oxygen-containing dielectric, as discussed above. In some embodiments, the oxide layer is MnSi$_x$O$_y$. As a result of oxide layer formation during annealing, some of the Ru or Co present in the layer 222 may become oxidized, which may unfavorably increase resistance of the layer 222 for electroplating purposes. Accordingly, a reducing agent, such as H$_2$ or the like, may be provided after the annealing process is completed to reduce the oxidized Ru or Co formed during the anneal. In some embodiments, the substrate may be exposed to an atmosphere comprising H$_2$ to reduce the oxidized Ru or Co.

At 106, a conductive material 224 may be deposited to on the layer 222 to fill the opening 202. As discussed above, the conductive material 224 may be deposited by an electroplating or a similar processing technique. The layer 222 may function as a seed layer upon which the conductive material 224 is deposited. The conductive material 224 may include metals, metal alloys, or the like, such as one or more of copper (Cu), Al, W, or the like. In some embodiments, the conductive material 224 is Cu.

Thus, methods for forming barrier/seed layers for interconnect structures have been provided herein. The inventive methods advantageously facilitate improved efficiency, process throughput, and device quality through one or more of reduced barrier/seed layer thickness, reduced barrier/seed layer resistance, or increased deposition rates. The inventive methods may be utilized with any device nodes, but may be particularly advantageous in device nodes of about 22 nm or less. Further, the inventive methods may be utilized with any type of interconnect structure or material, but may be particularly advantageous with interconnect structures formed by electroplating Cu.

While the foregoing is directed to embodiments of the present invention, other and further embodiments of the invention may be devised without departing from the basic scope thereof.

The invention claimed is:

1. A method of processing a substrate having an opening formed in a first surface of the substrate, the opening having a sidewall and a bottom, the method comprising:

forming a first layer comprising manganese (Mn) and cobalt (Co) on a dielectric surface of the sidewall and on a conductive surface of the bottom of the opening by flowing a manganese-containing gas and a cobalt-containing gas together for a first period of time on the dielectric surface and the conductive surface, the first layer having about 10 to about 50 percent manganese throughout and forming a conductive layer over the conductive surface;

forming a second layer comprising manganese and cobalt on the first layer by flowing the manganese-containing gas and a cobalt-containing gas for a second period of time, wherein a ratio of the manganese-containing gas to the cobalt-containing gas is decreased between a beginning and an end of the second period of time by reducing the flow of the manganese-containing gas while keeping the flow of cobalt-containing gas constant;

forming a third layer comprising cobalt on the second layer by flowing the cobalt-containing gas without flowing the manganese-containing gas for a third period of time; and depositing a conductive material on the third layer to fill the opening.

2. The method of claim 1, wherein the opening has an aspect ratio of height to width of at least 5:1.

3. The method of claim 1, wherein the conductive material is deposited by an electroplating process.

4. The method of claim 3, wherein the conductive material is copper (Cu).

5. The method of claim 1, wherein formation of the first layer, the second layer, and the third layer further comprise: flowing a reducing agent.

6. The method of claim 5, wherein the reducing agent comprises at least one of hydrogen ($H_2$), ammonia ($NH_3$), oxygen ($O_2$), hydrocarbon compounds, or hydrogen incorporated compounds.

7. A method of processing a substrate having an opening formed in a first surface of the substrate, the opening having a sidewall and a bottom, the method comprising:

forming a first layer comprising manganese (Mn) and at least one of ruthenium (Ru) or cobalt (Co) on a dielectric surface of the sidewall and on a conductive surface of the bottom of the opening by flowing a manganese-containing gas and at least one of a ruthenium-containing gas or a cobalt-containing gas together for a first period of time on the dielectric surface and the conductive surface, the first layer having about 10 to about 50 percent manganese throughout and forming a conductive layer over the conductive surface;

forming a second layer comprising manganese and at least one of ruthenium or cobalt on the first layer by flowing the manganese-containing gas and at least one of a ruthenium-containing gas or a cobalt-containing gas for a second period of time, wherein a ratio of the manganese-containing gas to the flowed ruthenium-containing gas or cobalt-containing gas is decreased between a beginning and an end of the second period of time by reducing the flow of the manganese-containing gas while keeping the flow of the flowed ruthenium-containing gas or cobalt-containing gas constant;

forming a third layer comprising at least one of ruthenium or cobalt on the second layer by flowing the ruthenium-containing gas or the cobalt-containing gas without flowing the manganese-containing gas for a third period of time; and depositing a conductive material on the third layer to fill the opening.

8. The method of claim 1, further comprising:

forming the first, second, or third layer at a temperature ranging from about 130 to about 350 degrees Celsius.

9. The method of claim 1, wherein the conductive surface of the bottom comprises copper (Cu).

10. A method of processing a substrate having an opening formed in a first surface of the substrate, the opening having a sidewall and a bottom, the method comprising:

forming a first layer comprising manganese (Mn) and one of ruthenium (Ru) or cobalt (Co) on a dielectric surface of the sidewall and on a conductive surface of the bottom of the opening by flowing a manganese-containing gas and one of a ruthenium-containing gas or a cobalt-containing gas together for a first period of time to on the dielectric surface and the conductive surface, the first portion of the layer having about 10 to about 50 percent manganese throughout and forming a conductive layer over the conductive surface;

forming a second layer comprising manganese and one of ruthenium or cobalt on the first layer by flowing the manganese-containing gas and one of the ruthenium-containing gas or cobalt-containing gas for a second period of time, wherein a ratio of the manganese-containing gas to the one of the ruthenium-containing gas or cobalt-containing gas is decreased between a beginning and an end of the second period of time;

forming a third layer comprising one of ruthenium or cobalt on the second layer by flowing the one of the ruthenium-containing gas or cobalt-containing gas without flowing the manganese-containing gas for a third period of time; and depositing a conductive material on the third layer to fill the opening.

11. The method of claim 1, further comprising:

flowing a purging gas after forming the first layer and before forming the second layer; and flowing a purging gas after forming the second layer and before forming the third layer.

* * * * *

UNITED STATES PATENT AND TRADEMARK OFFICE
CERTIFICATE OF CORRECTION

PATENT NO. : 9,926,639 B2
APPLICATION NO. : 13/167001
DATED : March 27, 2018
INVENTOR(S) : Hoon Kim et al.

Page 1 of 1

It is certified that error appears in the above-identified patent and that said Letters Patent is hereby corrected as shown below:

Column 8, Line 19, in Claim 10, in the phrase "first period of time to on the dielectric surface", delete "to" after the word "time" and before the word "on."

Column 8, Line 21, in Claim 10, delete "portion of the."

Signed and Sealed this
Twelfth Day of June, 2018

Andrei Iancu
*Director of the United States Patent and Trademark Office*